(12) United States Patent
Sugizaki et al.

(10) Patent No.: US 8,367,523 B2
(45) Date of Patent: Feb. 5, 2013

(54) METHOD FOR MANUFACTURING SEMICONDUCTOR LIGHT-EMITTING DEVICE AND SEMICONDUCTOR LIGHT EMITTING DEVICE

(75) Inventors: Yoshiaki Sugizaki, Kanagawa-ken (JP); Akihiro Kojima, Kanagawa-ken (JP); Masanobu Ando, Kanagawa-ken (JP); Kazuyoshi Furukawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 365 days.

(21) Appl. No.: 12/726,452

(22) Filed: Mar. 18, 2010

(65) Prior Publication Data
US 2011/0073890 A1    Mar. 31, 2011

(30) Foreign Application Priority Data
Sep. 25, 2009   (JP) .................................. 2009-220435

(51) Int. Cl.
*H01L 21/46* (2006.01)
*H01L 21/00* (2006.01)
(52) U.S. Cl. .......... 438/464; 438/33; 438/113; 438/458; 438/463
(58) Field of Classification Search .............. 438/25, 438/26, 33, 68, 113, 458, 462–464; 257/E21.482, 257/E33.057
See application file for complete search history.

(56) References Cited

U.S. PATENT DOCUMENTS

| 7,202,141 | B2 | 4/2007 | Park et al. |
| 7,256,483 | B2 | 8/2007 | Epler et al. |
| 7,772,020 | B2 * | 8/2010 | Yoo ................. 438/29 |
| 2003/0222334 | A1 * | 12/2003 | Ikeda et al. ........... 257/678 |
| 2009/0001504 | A1 * | 1/2009 | Takei et al. ........... 257/507 |
| 2010/0148198 | A1 | 6/2010 | Sugizaki et al. |

\* cited by examiner

*Primary Examiner* — Hung Vu
(74) *Attorney, Agent, or Firm* — Turocy & Watson, LLP (57) ABSTRACT

A method for manufacturing a semiconductor light-emitting device of the invention includes: forming a semiconductor layer including a light-emitting layer and a first interconnect layer on a major surface of a temporary substrate; dividing the semiconductor layer and the first interconnect layer into a plurality of chips by a trench; collectively bonding each divided portion of the first interconnect layer of a plurality of chips to be bonded not adjacent to each other out of the plurality of chips on the temporary substrate to a second interconnect layer while opposing the major surface of the temporary substrate and the major surface of a supporting substrate forming the second interconnect layer, and collectively transferring a plurality of the bonded chips from the temporary substrate to the supporting substrate after irradiating interfaces between the bonded chips and the temporary substrate and separating the chips and the temporary substrate from each other.

11 Claims, 8 Drawing Sheets

FIG. 8B

METHOD FOR MANUFACTURING SEMICONDUCTOR LIGHT-EMITTING DEVICE AND SEMICONDUCTOR LIGHT EMITTING DEVICE

CROSS-REFERENCE TO RELATED APPLICATIONS

This application is based upon and claims the benefit of priority from the prior Japanese Patent Application No. 2009-220435, filed on Sep. 25, 2009; the entire contents of which are incorporated herein by reference.

BACKGROUND

Nitride-based LEDs (light-emitting diodes), for example, can be manufactured by epitaxial growth on a sapphire substrate. Thus far, removing the sapphire substrate has been performed in view of increasing light extraction efficiency. In this case, since LED epitaxial layers are very thin, supporting the LED epitaxial layers with a supporting substrate before removing the sapphire substrate has been performed.

For example, the specification of U.S. Pat. No. 7,256,483 discloses a method in which a sapphire substrate and LED epitaxial layers in a wafer state undergo dicing to be fragment, each resulting LED chip is mounted on a supporting substrate, and then the sapphire substrate is removed for each chip by the laser lift-off method. In this case, since mounting on the supporting substrate and removing the sapphire substrate are performed for each fragment chip, the method is inefficient.

SUMMARY

According to an aspect of the invention, there is provided a method for manufacturing a semiconductor light-emitting device including: forming a semiconductor layer including a light-emitting layer on a major surface of a temporary substrate; forming a first interconnect layer, on a second major surface side of the semiconductor layer on a side opposite to a first major surface in contact with the major surface of the temporary substrate; forming a trench penetrating through the first interconnect layer and the semiconductor layer to reach the temporary substrate and dividing the semiconductor layer and the first interconnect layer into a plurality of chips by the trench; forming a second interconnect layer on a major surface of a supporting substrate; opposing the major surface of the temporary substrate and the major surface of the supporting substrate to each other and bonding collectively each divided portion of the first interconnect layer of a plurality of chips to be bonded not adjacent to each other out of the plurality of chips on the temporary substrate, to the second interconnect layer; irradiating interfaces between the first major surfaces of the chips to be bonded to the second interconnect layer and the temporary substrate with laser light to separate the chips to be bonded and the temporary substrate and transferring collectively the plurality of chips to be bonded from the temporary substrate to the supporting substrate; and cutting off a portion of the supporting substrate on an outside of a region to which the chip is bonded.

According to another aspect of the invention, there is provided a semiconductor light-emitting device including: a chip including: a semiconductor layer including: a light-emitting layer; a first major surface extracting light emitted from the light-emitting layer; and a second major surface on a side opposite to the first major surface; and a first interconnect layer provided on the second major surface side of the semiconductor layer; a second interconnect layer bonded to the first interconnect layer; and a supporting substrate supporting the chip bonded to the second interconnect layer formed on a major surface of the supporting substrate and having a larger planar size than the chip, the chip having been selected from chips not adjacent to each other among a plurality of chips formed away from each other on a temporary substrate, having been bonded to the second interconnect layer in a state of being supported with the temporary substrate, and having been transferred to the supporting substrate by separating the temporary substrate by irradiating an interface between the first major surface of the chip and the temporary substrate with laser light.

According to still another aspect of the invention, there is provided a semiconductor light-emitting device including: a chip including: a semiconductor layer including: a light-emitting layer; a first major surface extracting light emitted from the light-emitting layer; and a second major surface on a side opposite to the first major surface; and a first interconnect layer provided on the second major surface side of the semiconductor layer; a second interconnect layer bonded to the first interconnect layer; and a supporting substrate supporting the chip bonded to the second interconnect layer formed on a major surface of the supporting substrate and having a larger planar size than the chip, wherein the semiconductor layer includes: a first semiconductor layer including the light-emitting layer; and a second semiconductor layer including the first major surface and having the first semiconductor layer stacked on a side opposite to the first major surface, the first interconnect layer includes: a first bonding metal electrically connected to the first semiconductor layer; a second bonding metal electrically connected to the second semiconductor layer; and a first insulating film provided between the first bonding metal and the second bonding metal, and the second interconnect layer includes: a third bonding metal bonded to the first bonding metal; a fourth bonding metal bonded to the second bonding metal; and a second insulating film provided between the third bonding metal and the fourth bonding metal, and wherein the first bonding metal is formed in an island shape, and the second bonding metal is formed in a closed planar shape surrounding continuously a periphery of the first bonding metal.

BRIEF DESCRIPTION OF THE DRAWINGS

FIGS. 3A to 6B are schematic cross-sectional views of a method for manufacturing the semiconductor light-emitting device; and FIGS. 7A to 8B are schematic plane views illustrating a process of transferring chips in the method manufacturing the semiconductor light emitting device.

DETAILED DESCRIPTION

Embodiments of the invention will now be described with reference to the drawings. In the drawings, similar components are marked with the same reference letter.

Figure 1:
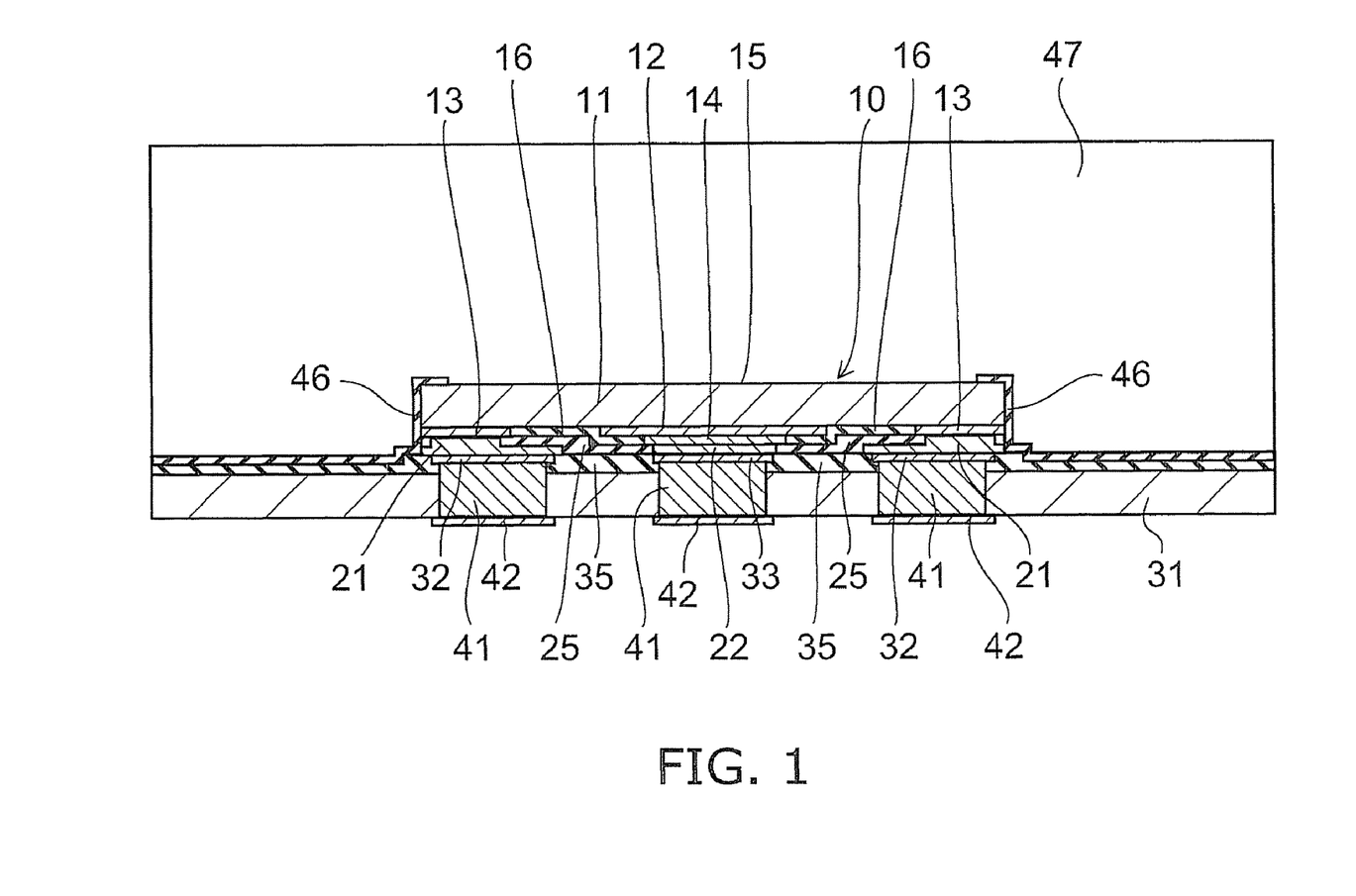
FIG. 1 is a schematic cross-sectional view of a semiconductor light-emitting device according to an embodiment of the invention.
Figure 2:
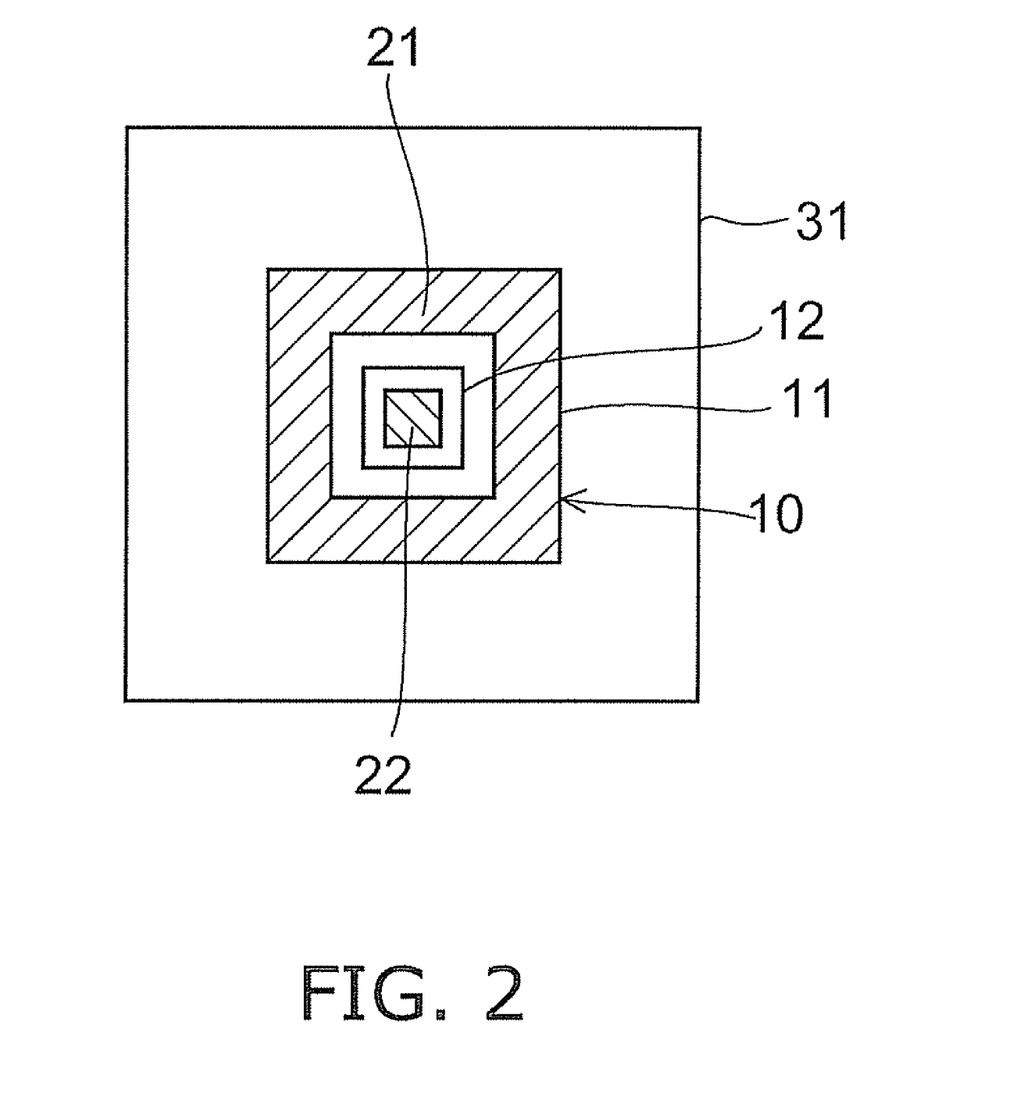
FIG. 2 is a schematic view illustrating a planar layout of the main components of the semiconductor light-emitting device.

FIG. 1 is a schematic cross-sectional view of a semiconductor light-emitting device according to an embodiment of the invention. FIG. 2 is a schematic view illustrating a planar layout of the main components of the semiconductor light-emitting device.

A semiconductor light-emitting device according to this embodiment has a structure in which a chip 10 including a light-emitting layer is mounted on a supporting substrate 31 that has a larger planar size than the chip 10.

The chip 10 includes semiconductor layers 11 and 12 and an interconnect layer. The semiconductor layer 12 has a structure in which a light-emitting layer (or active layer) is placed between a p-type cladding layer and an n-type cladding layer. The semiconductor layer 11 is n-type, for example, and functions as a lateral-direction pathway of a current. However, the conductivity type of the semiconductor layer 11 is not limited to n-type but may be p-type.

A first major surface of the semiconductor layer 11 functions as a light extraction surface 15. The semiconductor layer 12 is provided on a second major surface on the side opposite to the light extraction surface 15. The semiconductor layer 12 has a smaller planar size than the semiconductor layer 11. For example, the semiconductor layer 12 is formed at the center in the planar direction of the second major surface of the semiconductor layer 11.

A p-side electrode 14, an n-side electrode 13, a p-side bonding metal 22, an n-side bonding metal 21, and insulating films 16 and 25 that form a first interconnect layer are provided on a surface of the chip 10 opposite to the light extraction surface 15.

The n-side electrode 13 is formed on a portion of the second major surface of the semiconductor layer 11 on which the semiconductor layer 12 is not provided. The p-side electrode 14 is formed on a surface of the semiconductor layer 12 on the side opposite to the surface in contact with the semiconductor layer 11.

The n-side bonding metal 21 is provided on a surface of the n-side electrode 13 on the side opposite to the surface in contact with the semiconductor layer 11. The n-side bonding metal 21 is formed so that an end on the side opposite to another end in contact with the n-side electrode 13 may be larger in planar size than the other end. The p-side bonding metal 22 is provided on a surface of the p-side electrode 14 opposite to the surface in contact with the semiconductor layer 12.

As illustrated in FIG. 2, the p-side bonding metal 22 is formed in a planar shape of a square island, for example, and the n-side bonding metal 21 is formed in a closed planar shape of a frame that surrounds continuously the periphery of the p-side bonding metal 22.

The insulating film 16 is provided between the n-side electrode 13 and the p-side electrode 14, and thus the n-side electrode 13 and the p-side electrode 14 are electrically insulated from each other. The insulating film 16 covers the semiconductor layers 11 and 12 between the n-side electrode 13 and the p-side electrode 14. The insulating film 16 is a silicon oxide film, for example.

The insulating film 25 is provided between the n-side bonding metal 21 and the p-side bonding metal 22, and thus the n-side bonding metal 21 and the p-side bonding metal 22 are electrically insulated from each other. The insulating film 25 covers the insulating film 16, a part of the surface of the n-side electrode 13, and a part of the surface of the p-side electrode 14. The insulating film 25 is a silicon oxide film, for example. Alternatively, a resin material such as polyimide may be used as the insulating film 25.

Although not illustrated in FIG. 1, the semiconductor layer 12 and the p-side electrode 14 may be formed so as to creep under the n-side bonding metal 21 via the insulating film 25. Such structure can make the area of the semiconductor layer 12, i.e., a light-emitting unit larger.

On the other hand, on the major surface of the supporting substrate 31, bonding metals 32 and 33 and an insulating film 35 are formed as a second interconnect layer. The bonding metals 32 and 33 are not covered with the insulating film 35 but are exposed. Portions of the major surface of the supporting substrate 31 other than the bonding metals 32 and 33 are covered with the insulating film 35. The n-side bonding metal 21 is bonded to the bonding metal 32, and the p-side bonding metal 22 is bonded to the bonding metal 33.

A surface of the chip 10 on the side opposite to the light extraction surface 15 is a bonding surface to the second interconnect layer on the supporting substrate 31 side. The n-side bonding metal 21, the p-side bonding metal 22, and the insulating film 25 are exposed at the bonding surface. The bonding surface of the chip 10 that includes the n-side bonding metal 21, the p-side bonding metal 22, and the insulating film 25 is flat over the entire bonding surface.

The bonding surface of the second interconnect layer that includes the bonding metals 32 and 33 and the insulating film 35 to the chip 10 is also flat over the entire bonding surface. Therefore, the chip 10 and the second interconnect layer formed on the supporting substrate 31 are bonded at their flat surfaces.

Copper, gold, nickel, silver, and the like may be used as the material of the n-side electrode 13, the p-side electrode 14, the n-side bonding metal 21, the p-side bonding metal 22, and the bonding metals 32 and 33 on the supporting substrate 31 side. Out of these, copper, which has a good thermal conductivity and a high migration tolerance, is more preferable.

The n-side bonding metal 21 and the bonding metal 32 are preferably a same kind of metal in terms of increasing the bonding strength. Similarly, the p-side bonding metal 22 and the bonding metal 33 are preferably a same kind of metal.

Through-vias are formed in the supporting substrate 31, and a contact electrode 41 is provided in the through-via. The through-vias are formed from the back surface of the supporting substrate 31 on the side opposite to the major surface thereof to reach the bonding metals 32 and 33, and the through-vias connect the bonding metals 32 and 33 and the back surface of the supporting substrate 31. The contact electrodes 41 provided in the through-vias are connected to the bonding metals 32 and 33. A pad 42 connected to the contact electrode 41 is formed on the back surface of the supporting substrate 31. In the case where the supporting substrate 31 has conductivity, an insulating film is formed on the inner wall of the through-via, and an insulating film is interposed also between the pad 42 and the supporting substrate 31.

The semiconductor layer 11 is electrically connected to some pads 42 formed on the back surface of the supporting substrate 31, via the n-side electrode 13, the n-side bonding metal 21, the bonding metal 32, and the contact electrode 41. The semiconductor layer 12 is electrically connected to the other pads 42 formed on the back surface of the supporting substrate 31, via the p-side electrode 14, the p-side bonding metal 22, the bonding metal 33, and the contact electrode 41. A current is supplied to the semiconductor layers 11 and 12 via these conductive materials, and thereby the light-emitting layer emits light.

External terminals such as solder balls and metal bumps are provided on the pads 42, and the semiconductor light-emitting device illustrated in FIG. 1 is mounted on a circuit substrate and the like via the external terminals. Here, a third interconnect layer may be formed below the bonding metal 32 and the bonding metal 33, i.e., on the supporting substrate 31 side thereof. Forming the third interconnect layer enables the contact electrode 41 to be placed at any position. For example, the contact electrode 41 may be formed on the outside of the region on which the semiconductor chip 10 is mounted, and thereby the pitch of the pad 42 can be widened, which facilitates mounting on a circuit substrate.

The side surface of the chip 10 is covered with a protective film 46 having insulating properties. The protective film 46 covers also the insulating film 35 on the major surface of the supporting substrate 31.

A phosphor layer 47 is provided on the light extraction surface 15 of the chip 10. The phosphor layer 47 can absorb the light from the light-emitting layer and emit a wavelength-converted light. Accordingly, a mixed light of the light from the light-emitting layer and the wavelength-converted light at the phosphor layer 47 can be emitted. For example, in the case where the light-emitting layer is of nitride type, blue light from the light-emitting layer and yellow light that is a wavelength-converted light at the yellow phosphor layer 47, for example, can be mixed to obtain the white, the warm white, and the like as a mixed color.

The phosphor layer 47 is provided also in the region opposed to the side surface of the chip 10 to cover the side surface of the chip 10 via the protective film 46. The protective film 46 is a film transparent to the light emitted by the light-emitting layer, such as a silicon oxide film. Since the light emitted from the side surface of the chip 10 also enters the phosphor layer 47, the brightness can be increased.

The chip 10 described above is formed first on a temporary substrate that is different from the supporting substrate 31, as described below. A plurality of chips 10 are formed on the wafer-shaped temporary substrate. One selected from among them as a chip to be bonded is bonded to the bonding metals 32 and 33 while being supported with the temporary substrate, and in this condition only the chip to be bonded is irradiated with laser light. Thereby, only the chip to be bonded is removed from the temporary substrate and thus transferred to the supporting substrate 31.

Hereinbelow, a method for manufacturing a semiconductor light-emitting device according to this embodiment will now be described with reference to FIG. 3A to FIG. 8B.

Figure 3A:
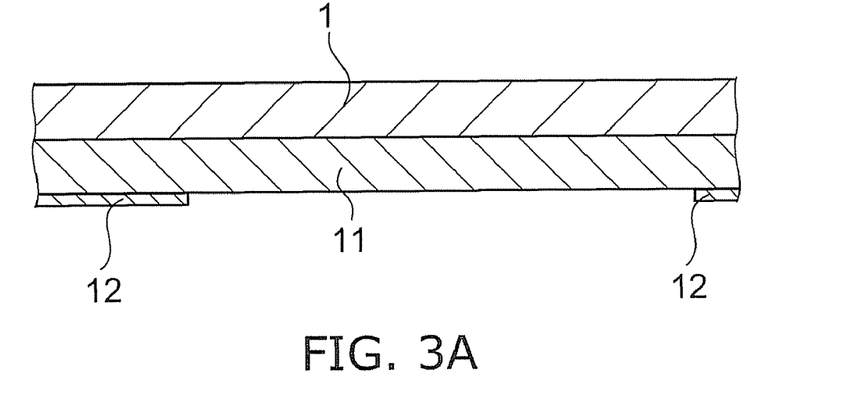

First, as illustrated in FIG. 3A, a semiconductor layer 11 is formed on a major surface of a temporary substrate 1, and a semiconductor layer 12 including a light-emitting layer is formed on a second major surface of the semiconductor layer 11 on the side opposite to the first major surface that is in contact with the temporary substrate 1. In the case where, for example, the light-emitting layer is a nitride-based semiconductor, the semiconductor layers 11 and 12 may be formed by crystal growth on a sapphire substrate. The semiconductor layer 12 is patterned and is selectively left on the second major surface of the semiconductor layer 11.

Figure 3B:
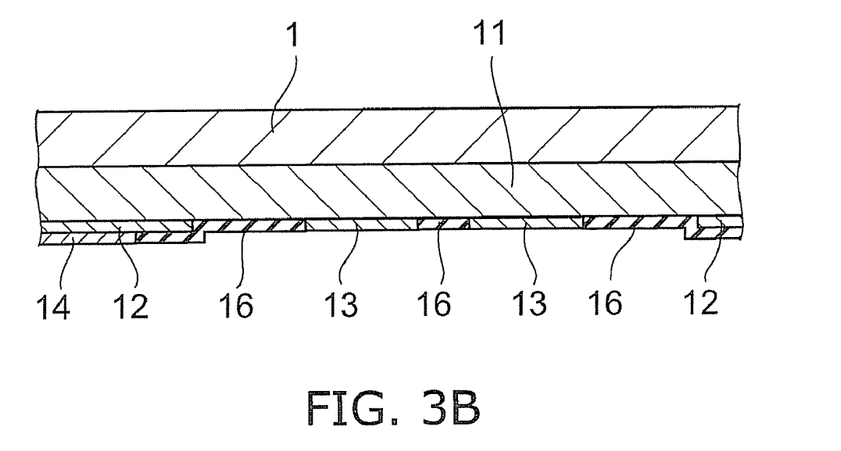

Next, as illustrated in FIG. 3B, n-side electrodes 13 are selectively formed on the second major surface of the semiconductor layer (n type semiconductor layer) 11, and p-side electrodes 14 are provided each on a face of the semiconductor layer (p type semiconductor layer) 12 on the side opposite to the surface in contact with the semiconductor layer 11.

Figure 3C:
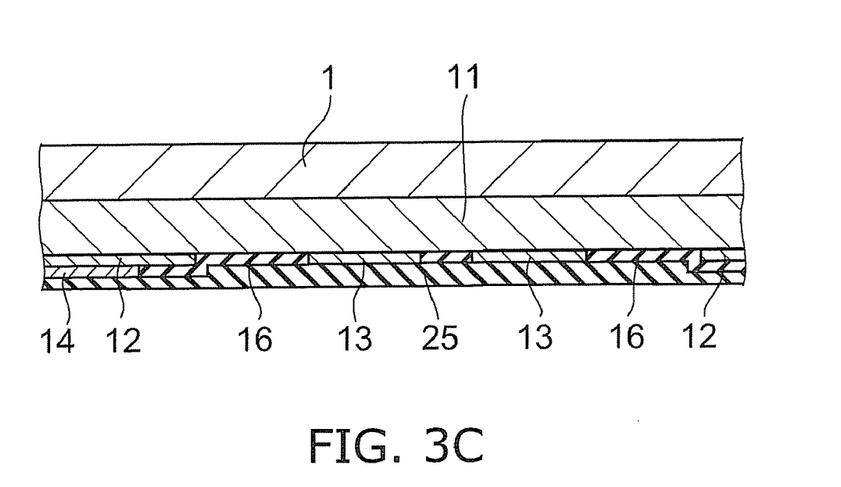

An insulating film 16 is formed between the semiconductor layer 12 and the n-side electrode 13, and between the p-side electrode 14 and the n-side electrode 13. Further, as illustrated in FIG. 3C, an insulating film 25 that covers the p-side electrode 14, the n-side electrode 13, and the insulating film 16 is formed, and the insulating film 25 is planarized.

Next, an opening that reaches the p-side electrode 14, an opening that reaches the n-side electrode 13, an opening for forming a p-side bonding metal 22 itself, and an opening for forming an n-side bonding metal 21 itself are formed in the insulating film 25. Then, a not-illustrated seed metal is formed in a region to which the p-side electrode 14, the n-side electrode 13, and the insulating film 25 are exposed, and electrolytic plating using the seed metal as a current pathway is performed.

Figure 4A:
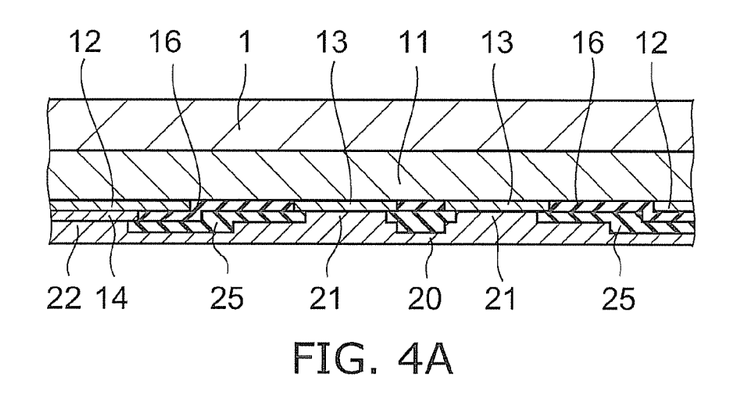

Thereby, as illustrated in FIG. 4A, a metal film 20 that covers the p-side electrode 14, the n-side electrode 13, and the insulating film 25 is formed. In the metal film 20, a portion connected to the n-side electrode 13 forms the n-side bonding metal 21, and a portion connected to the p-side electrode 14 forms the p-side bonding metal 22.

Figure 4B:
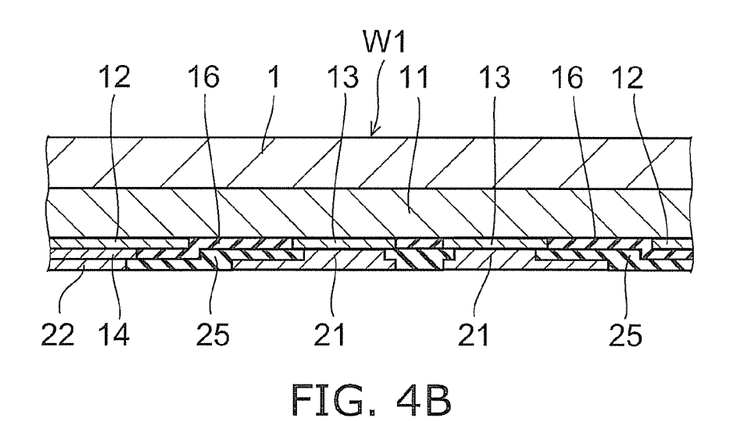

Then, the metal film 20 is polished by, for example, CMP (chemical mechanical polishing) until the surface of the insulating film 25 is exposed. Thereby, as illustrated in FIG. 4B, the n-side bonding metal 21 and the p-side bonding metal 22 are divided from each other. At this time, by removing also the seed metal on the surface of the insulating film 25, the electric connection between the n-side bonding metal 21 and the p-side bonding metal 22 via the seed metal is cut off. Thus, the n-side bonding metal 21 and the p-side bonding metal 22 are electrically independent of each other.

Figure 4C:
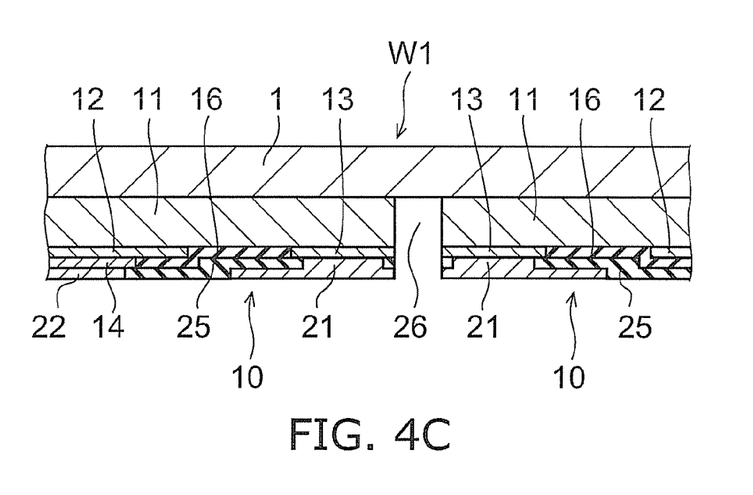

Next, as illustrated in FIG. 4C, a trench 26 is formed in the semiconductor layer 11 and the first interconnect layer to divide the above-described structure formed on the temporary substrate 1 into a plurality of chips 10. The trench 26 penetrates through the insulating film 25 between adjacent n-side bonding metals 21, the insulating film 16s between adjacent n-side electrodes 13, and the semiconductor layer 11 to reach the major surface of the temporary substrate 1. The trench 26 is formed by, for example, RIE (reactive ion etching) using a not-illustrated mask. Alternatively, the trench 26 may be formed by the laser ablation method.

The trench 26 is formed in a lattice shape on the temporary substrate 1, for example. Thereby, the n-side bonding metal 21 in each chip 10 becomes in a closed planar shape of a frame that surrounds continuously the periphery of the island-shaped p-side bonding metal 22, as illustrated in FIG. 2.

Figure 7A:
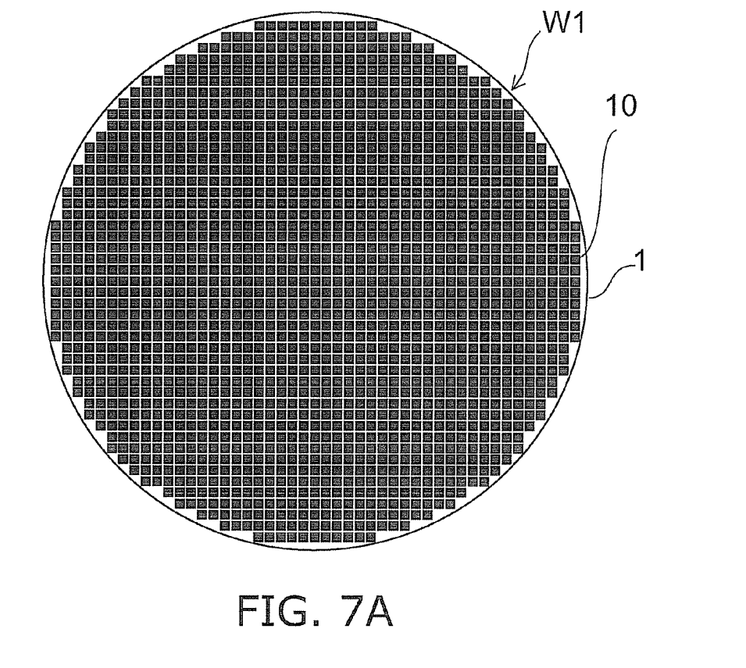

The configuration that includes the temporary substrate 1 and the plurality of chips 10 formed thereon and divided from each other by the lattice-shaped trench 26 is defined as a first wafer W1. FIG. 7A illustrates a schematic plan view of this first wafer W1. In FIG. 7A, the black squares represent the chips 10, and the white lines between the chips 10 represent the trench 26 described above.

Figure 5A:
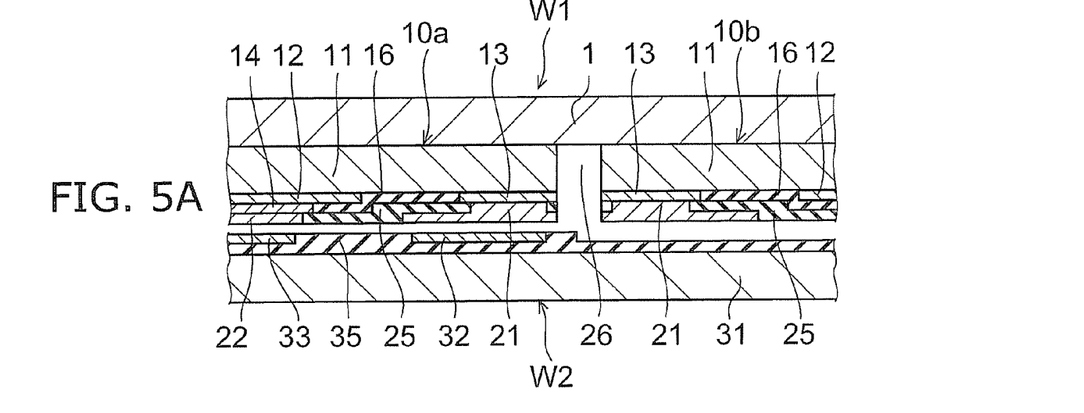

Aside from the first wafer W1, a second wafer W2 is prepared. The second wafer W2 has a structure in which a second interconnect layer is formed on the major surface of the supporting substrate 31, as illustrated in FIG. 5A.

The supporting substrate 31 is a silicon substrate or a glass substrate, for example. The second interconnect layer includes: an insulating film 35 that covers the major surface of the supporting substrate 31; and bonding metals 32 and 33 that are selectively formed on the surface of the insulating film 35. The insulating film 35 is interposed also between the bonding metal 32 and the bonding metal 33; therefore, the bonding metal 32 and the bonding metal 33 are insulated from each other by the insulating film 35.

The bonding metal 33 is formed in an island shape like the p-side bonding metal 22 of the first wafer W1, and the bonding metal 32 is formed in a closed planar shape of a frame that surrounds continuously the periphery of the bonding metal 33, like the n-side bonding metal 21 of the first wafer W1. The surfaces of the bonding metals 32 and 33 are exposed on the insulating film 35, and the surfaces of these bonding metals 32 and 33 and the surface of the insulating film 35 between the bonding metals 32 and 33 are planarized.

Next, a process of transferring the chip 10 from the temporary substrate 1 to the supporting substrate 31 will now be described. In this embodiment, a chip to be bonded 10a out of the plurality of chips 10 on the temporary substrate 1 is transferred to the supporting substrate 31.

FIG. 5A illustrates a state in which: the major surface of the temporary substrate 1 and the major surface of the supporting substrate 31 are opposed to each other; and the first wafer W1 and the second wafer W2 are position-adjusted. A n-side bonding metal 21 of the chip to be bonded 10a is opposed to the bonding metal 32 of the second wafer W2, and a p-side bonding metal 22 of the chip to be bonded 10a is opposed to the bonding metal 33 of the second wafer W2.

Figure 5B:
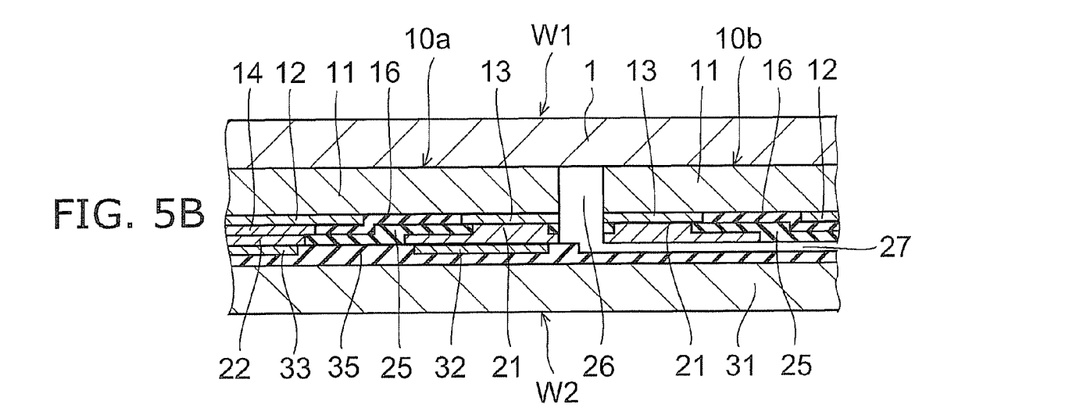

Then, as illustrated in FIG. 5B, the bonding metal 32 and the n-side bonding metal 21 are bonded, and the bonding metal 33 and the p-side bonding metal 22 are bonded. For example, the metals are bonded by heating while applying suppress strength on the bonding surfaces. In the case where, for example, copper materials are bonded, the materials are heated to 300° C. or higher. Alternatively, the bonding surfaces may be cleaned to be activated and then bonded at normal temperature only by suppress strength, without heating. As a matter of course, the bonding surfaces may be cleaned to be activated also in the case where heating is performed, which can increase the bonding strength. Further, in the case where metals of the same kind are bonded, a high bonding strength is obtained.

The bonding surface of the chip to be bonded 10a including the n-side bonding metal 21, the p-side bonding metal 22, and the insulating film 25 is flat over the entire bonding surface, and the bonding surface of the second wafer W2 including the bonding metals 32 and 33 and the insulating film 35 is also flat over the entire bonding surface. Therefore, the chip to be bonded 10a and the second wafer W2 are bonded at their flat surfaces.

As illustrated in FIG. 5B, the surface of the second wafer W2 opposed to a chip not to be bonded 10b may be made low in a state where the chip to be bonded 10a is bonded to the second wafer W2. This creates a gap 27 between the chip not to be bonded 10b and the second wafer W2, and thereby the chip not to be bonded 10b is not bonded to the second wafer W2.

Next, the temporary substrate 1 is stripped by using the laser lift-off method, for example. The laser light is applied toward the semiconductor layer 11 of the chip to be bonded 10a from the back surface side of the temporary substrate 1 opposite to the major surface on which the semiconductor layer 11 is formed. The laser light has transmission properties to the temporary substrate 1, and has a wavelength at which the laser light is absorbed in the semiconductor layer 11.

When the laser light reaches the interface between the temporary substrate 1 and the semiconductor layer 11, the semiconductor layer 11 near the interface absorbs the energy of the laser light to be decomposed. In the case where, for example, the semiconductor layer 11 is GaN, it is decomposed into Ga and nitrogen gas. By this decomposition reaction, a small gap is formed between the temporary substrate 1 and the semiconductor layer 11 of the chip to be bonded 10a, and the temporary substrate 1 and the semiconductor layer 11 of the chip to be bonded 10a are separated.

At the time of the irradiation with the laser light mentioned above, gas is generated because the semiconductor layer 11 is rapidly decomposed. At this time, in this embodiment, the chip to be bonded 10a is stably fixed onto the supporting substrate 31, which is a rigid body such as silicon or glass, by bonding at the flat surfaces. Further, there is a space at the outer periphery of the chip to be bonded 10a, which forms a way out for the gas mentioned above. Therefore, the chip 10a bonded can be prevented from being broken or crushed by the shock caused by the gas mentioned above.

In the case where, for example, the semiconductor layer 11 that is a GaN layer is epitaxially grown on the temporary substrate 1 that is a sapphire substrate, compressive stresses are easily accumulated in the semiconductor layer 11 that is a GaN layer, due to the difference in coefficient of thermal expansion between the sapphire and the GaN. When the temporary substrate 1 is separated from the semiconductor layer 11 and the semiconductor layer 11 is released from the restriction by the temporary substrate 1, then the compressive stresses accumulated in the semiconductor layer 11 are released and the semiconductor layer 11 tends to expand rapidly in the planar direction.

In this embodiment, the n-side bonding metal 21 and the bonding metal 32 that form a bonding section of the chip 10 on the edge side are formed in a planar shape of a frame, as described above. Therefore, the edge side of the chip 10 is fixed to the supporting substrate 31 evenly without bias in the direction along the edge portion. Accordingly, even if an expansion occurs in the planar direction of the semiconductor layer 11, the chip 10 can be firmly fixed to the supporting substrate 31 in all directions of the edge portion of the chip. Consequently, a large amount of stress acting on the chip 10 locally can be suppressed, and thus the chip 10 can be prevented from getting damaged.

Further, since the n-side electrode 13 and the n-side bonding metal 21 are formed evenly in the direction along the edge portion of the chip 10, a current can be supplied evenly in the planar direction of the chip 10, which serves to improve the light-emission efficiency.

Figure 5C:
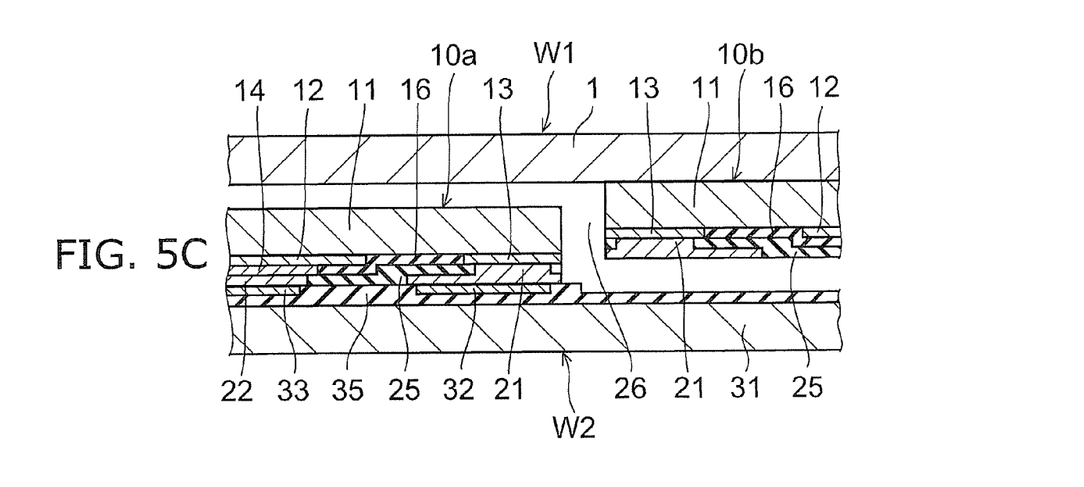

After all chips to be bonded 10a are irradiated with laser light, the second wafer W2 and the first wafer W1 are separated, as illustrated in FIG. 5C. Thereby, the chips to be bonded 10a are transferred from the temporary substrate 1 to the supporting substrate 31.

Chips not to be bonded 10b are separated from the chips to be bonded 10a by the trench 26 and are not bonded to the second wafer W2. Further, the chips not to be bonded 10b are not irradiated with laser light, and the semiconductor layers 11 thereof and the temporary substrate 1 are not separated. Therefore, the chips not to be bonded 10b are not transferred to the second wafer W2 but are left on the temporary substrate 1. The chips 10b left on the temporary substrate 1 are transferred to another supporting substrate 31 by a method like the above.

All chips 10 on the temporary substrate 1 illustrated in FIG. 7A are transferred to different supporting substrates 31 multiple courses. In this embodiment, the chips 10 on the temporary substrate 1 are transferred to four different supporting substrates 31 by four courses, for example.

Figure 7B:
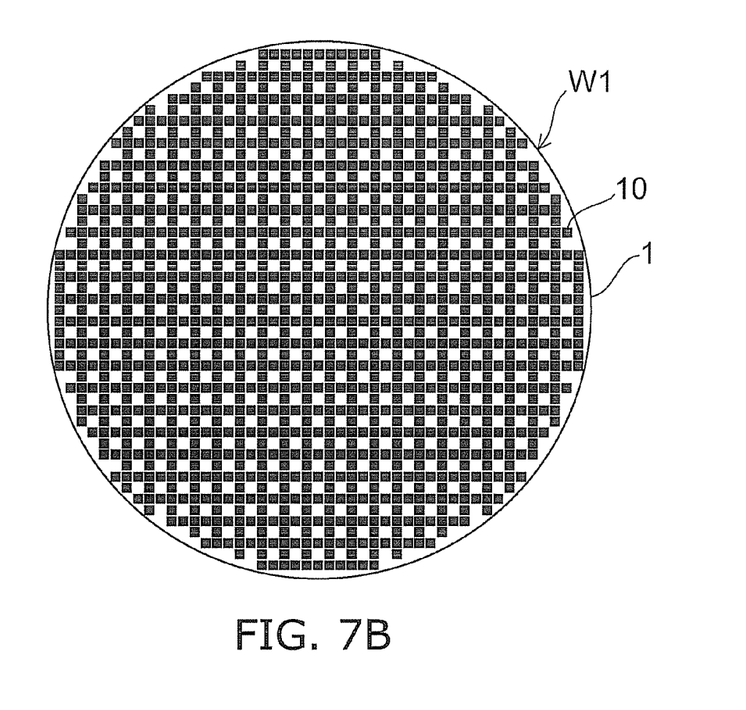

FIG. 7B illustrates the first wafer W1 after the first chip transfer process. One fourth of all the chips 10 in FIG. 7A have been transferred from the temporary substrate 1 to a supporting substrate 31 as chips to be bonded. A plurality of chips 10 that are not adjacent to each other and are placed at regular intervals on the temporary substrate 1 are collectively bonded to the second interconnect layer of the second wafer W2. Then, the chips 10 bonded to the second interconnect layer are irradiated with laser light, and the temporary substrate 1 is removed from the second wafer W2. Thereby, the plurality of chips 10 can be collectively transferred from the temporary substrate 1 to the supporting substrate 31.

On the supporting substrate 31, bonding surfaces that includes the bonding metals 32 and 33 are laid out at a pitch corresponding to the chips to be bonded 10a. When the first wafer W1 and the second wafer W2 are the same in diameter, the whitely-drawn portions of the first wafer W1 illustrated in FIG. 7B from which chips have been removed correspond to the layout of portions of the second wafer W2 where the bonding metals 32 and 33 are formed. Further, the whitely-drawn portions correspond to the layout of the chips 10 in the second wafer W2. Therefore, the arrangement pitch of the chips 10 that are transferred onto the supporting substrate 31 is greater than the arrangement pitch of all the chips 10 that are formed on the temporary substrate 1 illustrated in FIG. 7A.

Accordingly, when dicing the second wafer W2 to break it into individual light-emitting devices, the fragmentation can be performed while keeping the planar size of the supporting substrate 31 larger than the planar size of the chips 10. By breaking the second wafer W2 while keeping the planar size of the supporting substrate 31 larger than the planar size of the chips 10, the light-emitting device thus fragmentized (illustrated in FIG. 1) can be easily mounted on a circuit substrate and the like with high accuracy. Furthermore, since the supporting substrate 31 is large, heat radiation properties are high. Thus, the reliability and the lifetime of light-emitting device can be improved.

Figure 8A:
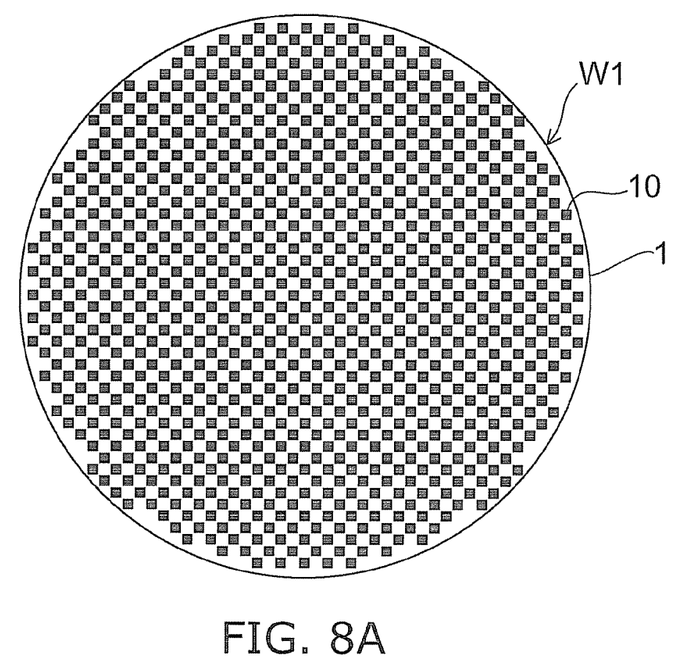

Out of the chips 10 illustrated in FIG. 7B that are left on the temporary substrate 1 after the first chip transfer process, another one fourth of the chips 10 are transferred to another supporting substrate 31. FIG. 8A illustrates the first wafer W1 after this second chip transfer. At this time also, a plurality of chips 10 placed at regular intervals and at an arrangement pitch greater than the arrangement pitch of all the chips 10 that are initially formed on the temporary substrate 1 are collectively bonded to the second interconnect layer of the second wafer W2 as chips to be bonded. Then, the chips 10 bonded to the second interconnect layer are irradiated with laser light, and the temporary substrate 1 is removed from the second wafer W2. Thereby, the plurality of chips 10 can be collectively transferred from the temporary substrate 1 to the supporting substrate 31.

Figure 8B:
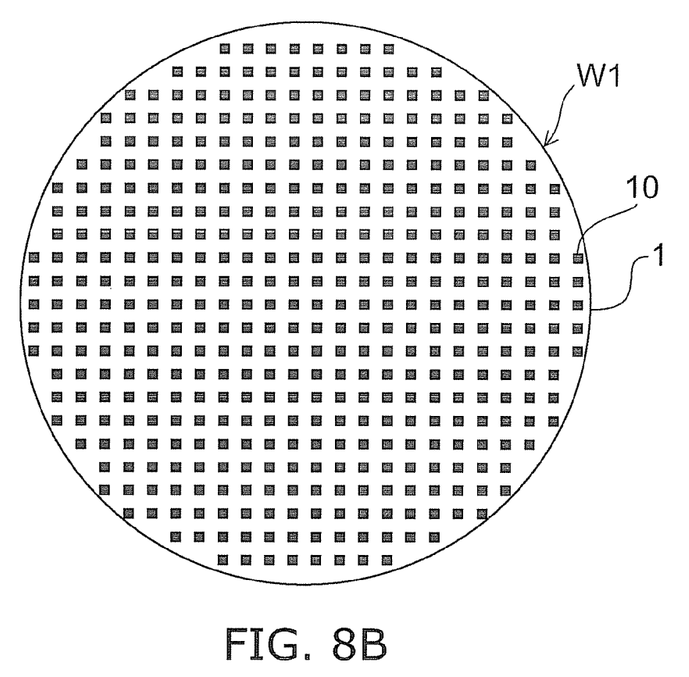

Out of the chips 10 illustrated in FIG. 8A that are left on the temporary substrate 1 after the second chip transfer process, yet another one fourth of the chips 10 are transferred to yet another supporting substrate 31. FIG. 8B illustrates the first wafer W1 after this third chip transfer. At this time also, a plurality of chips 10 placed at regular intervals and at an arrangement pitch greater than the arrangement pitch of all the chips 10 that are initially formed on the temporary substrate 1 are collectively bonded to the second interconnect layer of the second wafer W2 as chips to be bonded. Then, the chips 10 bonded to the second interconnect layer are irradiated with laser light, and the temporary substrate 1 is removed from the second wafer W2. Thereby, the plurality of chips 10 can be collectively transferred from the temporary substrate 1 to the supporting substrate 31.

Finally, all the remaining chips 10 illustrated in FIG. 8B are transferred to yet another supporting substrate 31. At this time also, a plurality of chips 10 placed at regular intervals and at an arrangement pitch greater than the arrangement pitch of all the chips 10 that are initially formed on the temporary substrate 1 are collectively bonded to the second interconnect layer of the second wafer W2 as chips to be bonded. Then, the chips 10 bonded to the second interconnect layer are irradiated with laser light, and the temporary substrate 1 is removed from the second wafer W2. Thereby, the plurality of chips 10 can be collectively transferred from the temporary substrate 1 to the supporting substrate 31.

As described above, according to this embodiment, a plurality of chips 10 can be collectively transferred from the temporary substrate 1 to the supporting substrate 31, and thus this embodiment is efficient. Furthermore, since the chips 10 are transferred to the supporting substrate 31 at a pitch greater than that of all the chips 10 that are initially formed on the temporary substrate 1, the planar size of the supporting substrate 31 can be made larger than the planar size of the chips 10. This facilitates mounting and heat radiation. Since the arrangement pitch of the chips 10 that are initially formed on the temporary substrate 1 is allowed to be small, there is no need to reduce the number of chips 10 obtainable from one first wafer W1.

In this embodiment, the selected ones from the chips 10 on the temporary substrate 1 that are to be bonded are transferred to the supporting substrate 31. Here, chips 10 located at regular intervals over the entire surface of the temporary substrate 1 may be selected as chips to be bonded, and thereby the chips 10 can be arranged uniformly without uneven distribution over the entire surface of the second wafer W2. Thus, the second wafer W2 can be utilized efficiently without wastage.

Figure 6A:
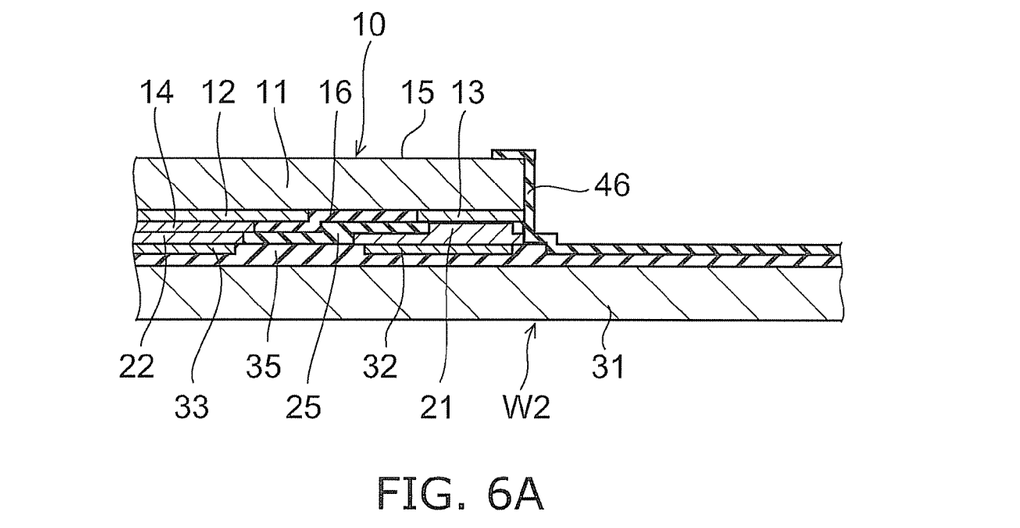

After the temporary substrate 1 is removed, substances that are generated by the decomposition during the laser lift-off and remain on the light extraction surface 15 of the chip 10 (for example, Ga) are removed by etching. Then, as illustrated in FIG. 6A, the side surface of the chip 10 is covered with a protective film 46. After that, concaves and convexes are formed on the surface of the light extraction surface 15 of the chip 10 to increase light extracting efficiency, as necessary.

Figure 6B:
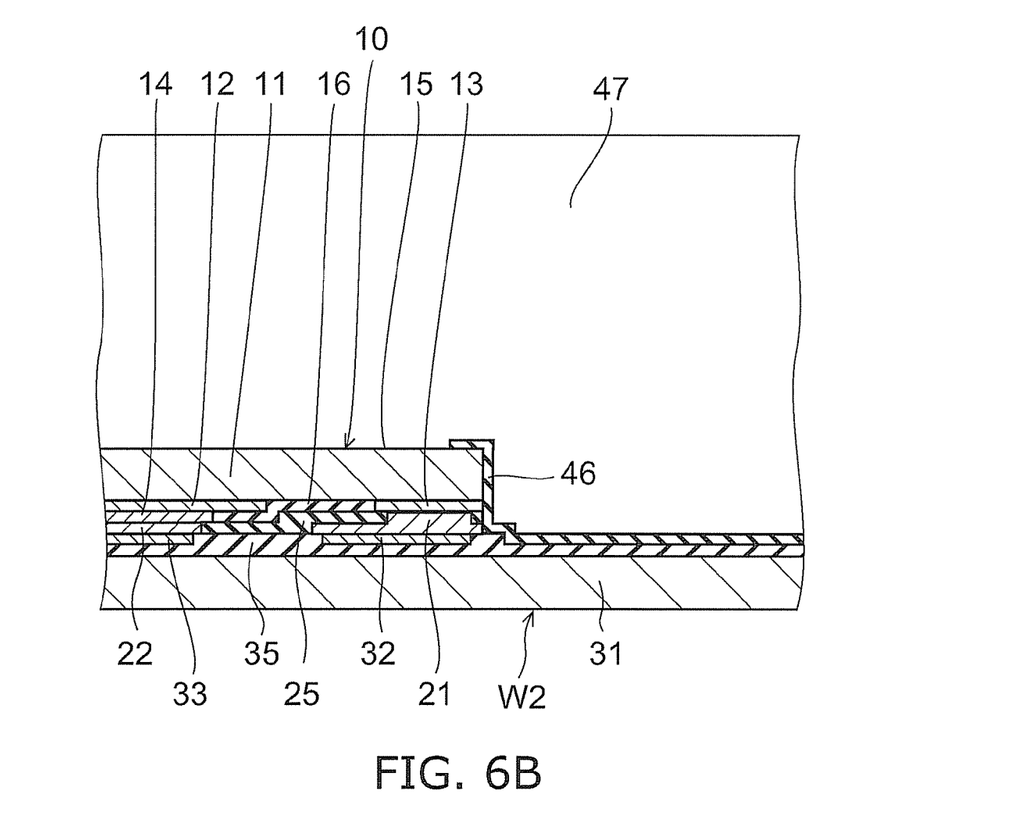

Next, as illustrated in FIG. 6B, a phosphor layer 47 is formed on the supporting substrate 31 so as to cover the light extraction surface 15 and the side surface of the chip 10. Since there is no temporary substrate 1 between the light extraction surface 15 and the phosphor layer 47, the light extraction efficiency can be increased. Furthermore, since the phosphor layer 47 is provided also in the region opposed to the side surface of the chip 10, the light emitted from the side surface of the chip 10 also can be used, by using a film transparent to the light emitted by the light-emitting layer (for example, a silicon oxide film) as the protective film 46.

After that, the contact electrode 41 and the pad 42 illustrated in FIG. 1 and the like are formed. Then, portions of the supporting substrate 31 on the outside of the region to which the chip 10 is bonded are cut off. The cut-off lines are formed in a lattice form on the wafer-shaped supporting substrate 31. Thereby, the fragmentized semiconductor light-emitting device illustrated in FIG. 1 is obtained.

Here, a third interconnect layer may be formed below the bonding metal 32 and the bonding metal 33, i.e., on the supporting substrate 31 side thereof. Forming the third interconnect layer enables the contact electrode 41 to be placed at any position. For example, the contact electrodes 41 may be formed on the outside of the region on which the semiconductor chip 10 is mounted, and thereby the pitch of the pad 42 can be widened, which facilitates mounting on a circuit substrate. The third interconnect layer may be formed on the undersurface of the supporting substrate 31. In this case, after the contact electrodes 41 are formed below the bonding metals 32 and 33, a structure, which the third interconnect layer electrically connected to the contact electrodes 41 on the under side of the supporting substrate 31 is wire-connected to the pads 42, is obtained.

In this embodiment, forming the semiconductor layers, the electrodes, the insulating films, and the bonding metals in the first wafer W1 is performed collectively in a wafer state, and forming the bonding metals and the insulating film in the second wafer W2 also is performed collectively in a wafer state. Furthermore, a plurality of chips 10 are collectively transferred from the temporary substrate 1 to the supporting substrate 31. That is, the processes described above before dicing are performed collectively in a wafer state. Therefore, the production is possible at low cost.

Hereinabove, embodiments of the invention are described with reference to specific examples. However, the invention is not limited to those examples but various modifications are possible based on the technical idea of the invention. One skilled in the art may perform various design modifications on the material, the size, the shape, the layout, and the like of the substrates, the semiconductor layers, the interconnect layers, and the like. Such modifications also are included in the scope of the invention to the extent that they do not deviate from the spirit of the invention.

The first wafer W1 may be processed before or after the second wafer W2. Alternatively, the first wafer W1 and the second wafer W2 may be concurrently processed.

The invention claimed is:

1. A method for manufacturing a semiconductor light-emitting device comprising:
    forming a semiconductor layer including a light-emitting layer on a major surface of a temporary substrate;
    forming a first interconnect layer on a second major surface side of the semiconductor layer on a side opposite to a first major surface in contact with the major surface of the temporary substrate;
    forming a trench penetrating through the first interconnect layer and the semiconductor layer to reach the temporary substrate and dividing the semiconductor layer and the first interconnect layer into a plurality of chips by the trench;
    forming a second interconnect layer on a major surface of a supporting substrate;
    opposing the major surface of the temporary substrate and the major surface of the supporting substrate to each other and bonding collectively each divided portion of the first interconnect layer of a plurality of chips to be bonded not adjacent to each other out of the plurality of chips on the temporary substrate, to the second interconnect layer;
    irradiating interfaces between the first major surfaces of the chips to be bonded to the second interconnect layer and the temporary substrate with laser light to separate the chips to be bonded and the temporary substrate and transferring collectively the plurality of chips to be bonded from the temporary substrate to the supporting substrate; and
    cutting off a portion of the supporting substrate on an outside of a region to which each of the chips is bonded.

2. The method according to claim 1, wherein the forming the first interconnect layer includes:
    forming a first bonding metal and a second bonding metal electrically independent of each other; and
    forming a first insulating film between the first bonding metal and the second bonding metal.

3. The method according to claim 2, wherein the first bonding metal, the second bonding metal, and the first insulating film are formed over an entire bonding surface of the chip to the second interconnect layer, and the bonding surface including the first bonding metal, the second bonding metal, and the first insulating film is substantially planarized.

4. The method according to claim 3, wherein
    the forming the second interconnect layer includes:
        forming a third bonding metal to be bonded to the first bonding metal;
        forming a fourth bonding metal to be bonded to the second bonding metal; and
        forming a second insulating film between the third bonding metal and the fourth bonding metal, and
    a bonding surface of the third bonding metal, the fourth bonding metal, and the second insulating film to the chip is substantially planarized.

5. The method according to claim 3, wherein
    the first bonding metal is formed in an island shape, and
    the second bonding metal is formed in a closed ring shape surrounding continuously a periphery of the first bonding metal.

6. The method according to claim 1, further comprising transferring the chips remaining on the temporary substrate without being transferred to the supporting substrate to another supporting substrate.

7. The method according to claim 1, wherein a plurality of the chips placed at regular intervals on the temporary substrate are collectively transferred to the supporting substrate as the chips to be bonded.

8. The method according to claim 1, wherein the first interconnect layer and the second interconnect layer are bonded to each other with a same kind of metal.

9. The method according to claim 1, wherein a gap is formed between a chip other than the chips to be bonded and the supporting substrate in a state where the major surface of the temporary substrate and the major surface of the supporting substrate are opposed to each other and the chips to be bonded are bonded to the second interconnect layer.

10. The method according to claim 1, further comprising providing a phosphor layer on the first major surface of the semiconductor layer after separating the temporary substrate.

11. The method according to claim 10, further comprising:
    covering a side surface of the chip with a protective film transparent to the light emitted from the light-emitting layer after separating the temporary substrate; and
    providing the phosphor layer also in a region opposed to the side surface with the protective film interposed.

* * * * *